(12) United States Patent
Mi

(10) Patent No.: US 8,937,610 B2
(45) Date of Patent: *Jan. 20, 2015

(54) DUAL-SUBSTRATE CAPACITIVE TOUCH PANEL

(71) Applicant: TPK Touch Solutions Inc., Taipei (TW)

(72) Inventor: David Mi, Taoyuan (TW)

(73) Assignee: TPK Touch Solutions Inc., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/920,035

(22) Filed: Jun. 17, 2013

(65) Prior Publication Data

US 2013/0277196 A1    Oct. 24, 2013

Related U.S. Application Data

(63) Continuation of application No. 12/803,763, filed on Jul. 6, 2010, now Pat. No. 8,487,904.

(30) Foreign Application Priority Data

May 11, 2010    (TW) ............................... 99114885 A

(51) Int. Cl.
  *G06F 3/045*    (2006.01)
  *H03K 17/96*    (2006.01)
  *G06F 3/044*    (2006.01)

(52) U.S. Cl.
  CPC ............. *H03K 17/962* (2013.01); *G06F 3/044* (2013.01); *G06F 2203/04103* (2013.01)
  USPC ...................................................... 345/174

(58) Field of Classification Search
  CPC ...... H03K 17/962; H03K 17/96; G06F 3/044; G06F 2203/04103

USPC .......................................... 345/174, 173, 197
  See application file for complete search history.

(56) References Cited

U.S. PATENT DOCUMENTS

| | | | |
|---|---|---|---|
| 8,487,904 B2 * | 7/2013 | Mi ................................ | 345/174 |
| 2002/0011992 A1 | 1/2002 | Muraoka et al. | |
| 2005/0030048 A1 | 2/2005 | Bolender et al. | |
| 2009/0001999 A1 | 1/2009 | Douglas | |

(Continued)

FOREIGN PATENT DOCUMENTS

| | | |
|---|---|---|
| JP | 2008250309 | 10/2008 |
| JP | 2009216978 | 9/2009 |
| JP | 2011192124 | 9/2011 |
| KR | 1020110110562 | 10/2011 |
| TW | 200846997 | 12/2008 |

(Continued)

*Primary Examiner* — Chanh Nguyen
*Assistant Examiner* — Tsegaye Seyoum
(74) *Attorney, Agent, or Firm* — Gokalp Bayramoglu

(57) ABSTRACT

A capacitive touch panel sequentially has a first glass substrate, a lower touch sensitive layer, a lower insulation ink layer, a lower conductor layer, a lower insulation layer, a lower conductive adhesive layer, a flexible circuit board, a transparent insulation adhesive layer, an upper insulation layer, an upper conductive adhesive layer, an upper conductor layer, an upper insulation ink layer, an upper touch sensitive layer and a second glass substrate. The aforementioned structure allows fabrication of the capacitive touch panel to be separated into a lower panel fabrication process and an upper panel fabrication process. The two independent fabrication processes prevent the capacitive touch panel from being damaged in one of the processes when the process is completed so as to increase the yield in production and further facilitate producing large-size touch panel.

30 Claims, 3 Drawing Sheets

(56) References Cited

U.S. PATENT DOCUMENTS

| | | |
|---|---|---|
| 2009/0315856 A1 | 12/2009 | Oikawa et al. |
| 2009/0321240 A1* | 12/2009 | Huang et al. .................. 200/512 |
| 2010/0006347 A1 | 1/2010 | Yang |
| 2010/0139955 A1* | 6/2010 | Long et al. .................... 174/257 |
| 2010/0090978 A1 | 10/2010 | Chen et al. |
| 2010/0265207 A1* | 10/2010 | Chen ............................ 345/174 |
| 2010/0283755 A1* | 11/2010 | Hsih ............................. 345/174 |
| 2011/0234526 A1 | 9/2011 | Mi |
| 2012/0319966 A1 | 12/2012 | Reynolds |

FOREIGN PATENT DOCUMENTS

| | | |
|---|---|---|
| TW | M348999 | 1/2009 |
| TW | M351407 | 2/2009 |
| TW | M355426 | 4/2009 |
| TW | M356623 | 5/2009 |
| TW | 200947278 | 11/2009 |
| TW | M369502 | 11/2009 |
| TW | 200949341 | 12/2009 |
| TW | M374617 | 2/2010 |
| WO | 2008047971 | 4/2008 |

* cited by examiner

DUAL-SUBSTRATE CAPACITIVE TOUCH PANEL

CROSS-REFERENCE TO RELATED APPLICATIONS

This application is a continuation application of Ser. No. 12/803,763, filed Jul. 6, 2010, which is incorporated herein by reference.

BACKGROUND OF THE INVENTION

1. Technical Field

The present invention is related to a capacitive touch panel, and more particularly to a capacitive touch panel having a relatively high yield in production and being suitable for manufacture of large-size touch panel.

2. Description of the Related Art

Existing touch panels can be classified as resistive touch panels and capacitive touch panels. Recently, the capacitive touch panels become increasingly popular in the market.

With reference to FIG. 3, a conventional touch panel has a first glass substrate 61, a lower touch sensitive layer 62, an upper touch sensitive layer 63, a flexible circuit board 64, a transparent insulation adhesive layer 65 and a second glass substrate 66. The first glass substrate 61 has a top surface and a bottom surface. The upper touch sensitive layer 63 and the lower touch sensitive layer 62 are respectively formed on the top surface and the bottom surface of the first glass substrate 61. The flexible circuit board 64 is mounted on the top surface of the first glass substrate 61 and is partially and electrically connected with the upper touch sensitive layer 63. The transparent insulation adhesive layer 65 is coated on the first glass substrate 61. The second glass substrate 66 is covered and bonded on the transparent insulation adhesive layer 65.

However, the conventional technology can only separately forms the upper touch sensitive layer 63 and the lower touch sensitive layer 62 on the top and the bottom surfaces of the first glass substrate 61, for example, forming the upper touch sensitive layer 63 first. Hence, when the lower touch sensitive layer 62 is formed subsequently, the completed upper touch sensitive layer 63 is easily scratched or stained during a fabrication process of the lower touch sensitive layer 62. As a result, the production yield is significantly lowered. Because of the low yield, such capacitive touch panels do not aim for large-size touch panel, thereby further limiting the application range thereof. Furthermore, as being exposed without any protection, the lower touch sensitive layer 62 is easily collided and damaged.

BRIEF SUMMARY OF THE INVENTION

An objective of the present invention is to provide a capacitive touch panel having a relatively high yield in production and being suitable for manufacture of large-size touch panel.

To achieve the foregoing objective, the capacitive touch panel has a first glass substrate, a lower touch sensitive layer, a lower insulation ink layer, a lower conductor layer, a lower insulation layer, a lower conductive adhesive layer, a flexible circuit board, a transparent insulation adhesive layer, an upper insulation layer, an upper conductive adhesive layer, an upper conductor layer, an upper insulation ink layer, an upper touch sensitive layer, and a second glass substrate.

The first glass substrate has a first circuit surface.

The lower touch sensitive layer is mounted on the first circuit surface of the first glass substrate.

The lower insulation ink layer is mounted on an edge portion of the lower touch sensitive layer so as to let an uncovered portion of the lower touch sensitive layer constitute a touch area, and has a plurality of lower through slots formed through an portion of the lower insulation ink layer covering the edge portion of the lower touch sensitive layer and each filled in with a lower conductive layer.

The lower conductor layer is mounted on the lower insulation ink layer and is electrically connected with the lower touch sensitive layer through the lower conductive layers filled in the corresponding lower through slots.

The lower insulation layer is mounted on the lower conductor layer and has a lower indentation to partially expose the lower conductor layer.

The lower conductive adhesive layer is mounted in the lower indentation of the lower insulation layer to cover the exposed portion of the lower conductor layer.

The flexible circuit board is mounted on the lower conductive adhesive layer, extends outwardly beyond the first glass substrate, and is electrically connected with the lower touch sensitive layer through the lower conductive adhesive layer and the lower conductive layers in the corresponding lower through slots.

The transparent insulation adhesive layer is mounted on the touch area and the lower insulation layer.

The upper insulation layer is mounted on the transparent insulation adhesive layer and has an upper indentation to expose the flexible circuit board.

The upper conductive adhesive layer is mounted in the upper indentation of the upper insulation layer to contact with the flexible circuit board.

The upper conductor layer is mounted on the upper conductive adhesive layer and the upper insulation layer.

The upper insulation ink layer is mounted on the upper conductor layer, and has a plurality of upper through slots formed through the upper insulation ink layer and each filled in with a upper conductive layer having a color identical to that of the upper insulation ink layer.

The upper touch sensitive layer is mounted on the transparent insulation adhesive layer, partially covers the upper insulation ink layer, and contacts with the upper conductive layers in the corresponding upper through slots of the upper insulation ink layer.

The second glass substrate is mounted on the upper touch sensitive layer and the upper insulation ink layer and has a second circuit surface in contact with the upper touch sensitive layer and the upper insulation ink layer.

Given the above-mentioned structure of the capacitive touch panel, the lower touch sensitive layer and the upper touch sensitive layer respectively contact with the first glass substrate and the second glass substrate. Upon fabricating the capacitive touch panel, the first glass substrate and the second glass substrate can be respectively mounted on the lower touch sensitive layer and the upper touch sensitive layer with different fabrication processes. As using sheet glass for fabrication of single-sided circuit layer is a mature technique, the resulting yield in production is relatively high, and the relatively high yield helps build large-size touch panel.

Other objectives, advantages and novel features of the invention will become more apparent from the following detailed description when taken in conjunction with the accompanying drawings.

DETAILED DESCRIPTION

Figure 1:
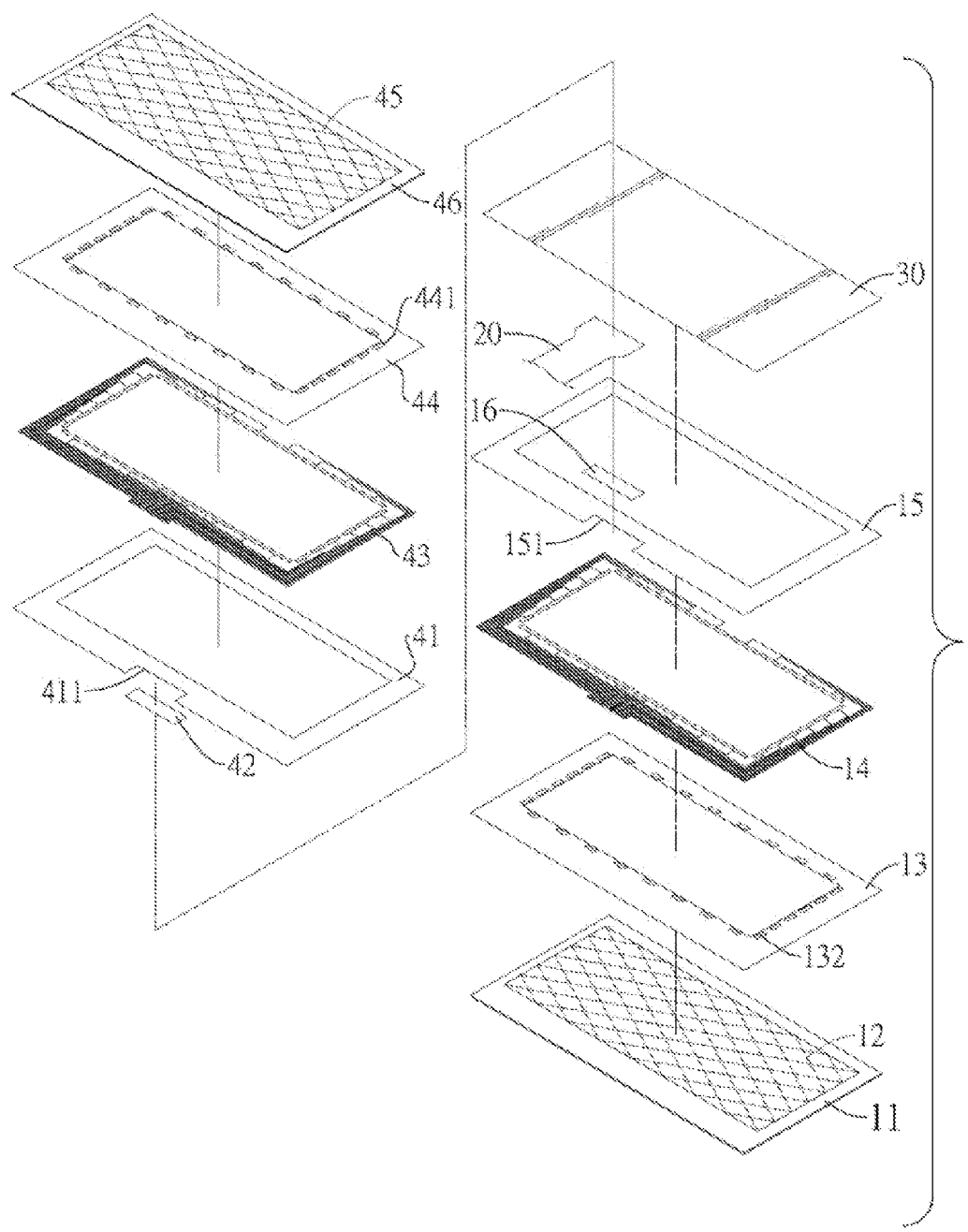
FIG. 1 is an exploded perspective view of a capacitive touch panel in accordance with the present invention.
Figure 2:
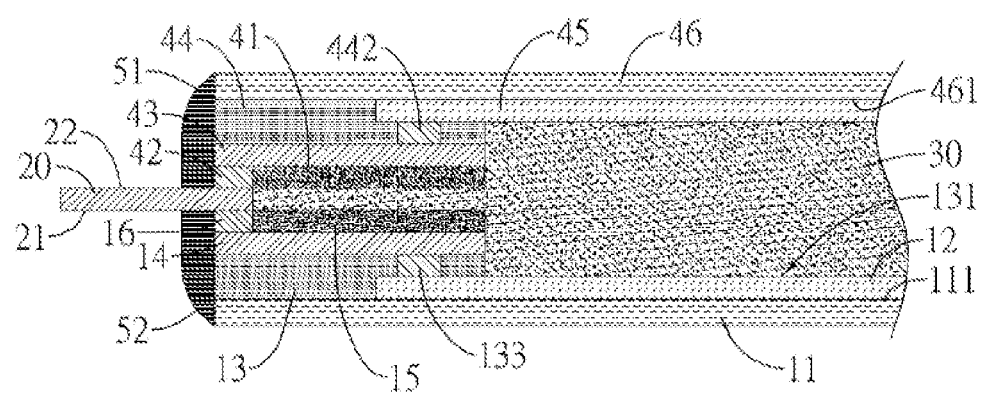
FIG. 2 is a partial cross-sectional view of the capacitive touch panel in FIG. 1.
Figure 3:
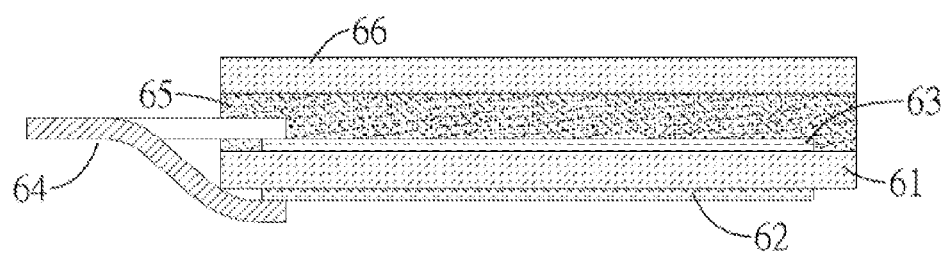
FIG. 3 is a cross-sectional view of a conventional capacitive touch panel.

With reference to FIGS. 1 and 2, a capacitive touch panel has a first glass substrate 11, a lower touch sensitive layer 12, a lower insulation ink layer 13, a lower conductor layer 14, a lower insulation layer 15, a lower conductive adhesive layer 16, a flexible circuit board 20, a transparent insulation adhesive layer 30, an upper insulation layer 41, an upper conductive adhesive layer 42, an upper conductor layer 43, an upper insulation ink layer 44, an upper touch sensitive layer 45, a second glass substrate 46, an upper protection layer 51 and a lower protection layer 52.

The first glass substrate 11 has a first circuit surface 111.

The lower touch sensitive layer 12 is mounted on the first circuit surface 111 of the first glass substrate 11. In the present embodiment, the lower touch sensitive layer 12 has a lower touch circuit of a double-layer touch electrode layer, such as an X-axis touch circuit.

The lower insulation ink layer 13 is mounted on an edge portion of the lower touch sensitive layer 12 so that an uncovered portion of the lower touch sensitive layer 12 constitutes a touch area 131. The lower insulation ink layer 13 has a plurality of lower through slots 132 formed through and portion thereof covering the edge portion of the lower touch sensitive layer 12. A lower conductor layer 133 is filled in each lower through slot 132. In the present embodiment, the lower insulation ink layer 13 is formed by printing and baking dark-color ink on the first circuit surface 111 of the first glass substrate 11. The portion of the lower insulation ink layer 13 may be printed with or without dark-color ink. Accordingly, the lower conductor layer 133 adopts a conductive matter having a color identical to or different from that of the lower insulation ink layer 13 as the plurality of lower through slots 132 are invisible regardless due to all the layers stacked on the lower insulation ink layer 13 and the lower conductive layer 133.

The lower conductor layer 14 is mounted on the lower insulation ink layer 13, and is electrically connected with the lower touch sensitive layer 12 through the lower conductive layers 133 filled in the lower through slots 132.

The lower insulation layer 15 is mounted on the lower conductor layer 14 to prevent the lower conductor layer 14 from being oxidized due to exposure to air. The lower insulation layer 15 has a lower indentation 151 to partially expose the lower conductor layer 14. In the present embodiment, the lower insulation layer 15 is made of a transparent insulation material.

The lower conductive adhesive layer 16 is mounted in the lower indentation 151 of the lower insulation layer 15 to cover the exposed portion of the lower conductor layer 14. In the present embodiment, the lower conductive adhesive layer is formed by anisotropic conductive film (ACT) or anisotropic conductive paste (ACP).

Upon fabricating the capacitive touch panel in accordance with the present invention, a lower panel fabrication process completing the first glass substrate 11, the lower touch sensitive layer 12, the lower insulation ink layer 13, the lower conductor layer 14, the lower insulation layer 15 and the lower conductive adhesive layer 16 can be conceived.

The flexible circuit board 20 has a top surface 21 and a bottom surface 22. The flexible circuit board 20 is mounted on the lower conductive adhesive layer 16 and the bottom surface 22 is attached on the lower conductive adhesive layer 16 and extends outwardly beyond the first glass substrate 11. The flexible circuit board 20 is electrically connected with the lower touch sensitive layer 12 through the lower conductive adhesive layer 16 and the lower conductive layers 133 in the lower through slots 132 of the lower insulation ink layer 13.

The transparent insulation adhesive layer 30 has a thick portion 301 and a thin portion 302. The thick portion 301 is mounted on the touch area 131 and the thin portion 302 is mounted on the lower insulation layer 15.

The upper insulation layer 41 is mounted on the transparent insulation adhesive layer 30 and has an upper indentation 411 to expose the flexible circuit board 20.

The upper conductive adhesive layer 42 is mounted in the upper indentation 411 of the upper insulation layer 41 to contact with the top surface 21 of the flexible circuit board 20.

The upper conductor layer 43 is mounted the upper conductive adhesive layer 42 and the upper insulation layer 41.

The upper insulation ink layer 44 is mounted on the upper conductor layer 43 and has a plurality of upper through slots 441 formed through the upper insulation ink layer 44. An upper conductive layer 442 is filled in each upper through slot 441 to contact with the upper conductor layer 43. In the present embodiment, the upper conductive layer 442 adopts a conductive matter having a color identical to that of the upper insulation ink layer 44 to conceal the upper through slots 441.

The upper touch sensitive layer 45 is mounted on the transparent insulation adhesive layer 30, partially covers the upper insulation ink layer 44 and contacts with the upper conductive layer 442 in the upper through slots 441 of the upper insulation ink layer 44. Accordingly, the upper touch sensitive layer 45 can be electrically connected with the flexible circuit board 20 through the upper conductive layers 442 in the upper through slots 441 of the upper insulation ink layer 44 and the upper conductive adhesive layer 42. In the present embodiment, the upper touch sensitive layer 45 is composed of an upper touch circuit of a double-layer touch electrode layer, such as a Y-axis touch circuit.

The second glass substrate 46 is mounted on the upper touch sensitive layer 45 and the upper insulation ink layer 44, and has a second circuit surface 461 in contact with the upper touch sensitive layer 45 and the upper insulation ink layer 44. When viewed from a side opposite to the second circuit surface 461 of the second glass substrate 46, the upper insulation ink layer 44 has a masking effect.

Upon fabricating the capacitive touch panel in accordance with the present invention, an upper fabrication process completing the upper insulation layer 41, the upper conductive adhesive layer 42, the upper conductor layer 43, the upper insulation ink layer 44, the upper touch sensitive layer 45 and the second glass substrate 46.

With further reference to FIG. 2, the upper protection layer 51 is bonded to the top surface 22 of the flexible circuit board 20 and a side of the second glass substrate 46 to protect the flexible circuit board 20 from directly contacting with a side of the second glass substrate 46 when the flexible circuit board 20 is bent. Therefore, the flexible circuit board 20 is free from cut and damage done by the second glass substrate 46 upon bending.

The lower protection layer 52 is bonded to a side portion of the capacitive touch panel between the bottom surface 21 of the flexible circuit board 20 and the first glass substrate 11 to provide similar protection to the flexible circuit board 20 as the upper protection layer 51 does.

The present invention addresses the following advantages:

Fabrication of the capacitive touch panel of the present invention can be separated into a lower panel fabrication process and an upper panel fabrication process. According to skill level of the current technology, the yield of using sheet glass to fabricate single-sided circuit layer is high. Hence, the structure of the capacitive touch panel of the present invention has a better yield than conventional capacitive touch panels in production.

As the yield of the present invention in production is better, the capacitive touch panel of the present invention can be applied to the fabrication of large-size touch panel, achieving a wider application range.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A capacitive touch panel, comprising:
    a lower panel comprising:
        a first glass substrate having a first circuit surface;
        a lower touch sensitive layer mounted on the first circuit surface of the first glass substrate; and
        a lower conductor layer mounted on the first circuit surface of the first glass substrate and electrically connecting the lower touch sensitive layer;
    an upper panel comprising:
        a second glass substrate having a second circuit surface;
        an upper touch sensitive layer mounted on the second circuit surface of the second glass substrate;
        an upper insulation ink layer mounted on an edge portion of the upper touch sensitive layer, and having a plurality of upper through slots formed through the upper insulation ink layer and each filled in with an upper conductive layer having a color identical to that of the upper insulation ink layer; and
        an upper conductor layer mounted on the upper insulation ink layer and electronically connecting the upper touch sensitive layer via the upper conductive layer; and
    a transparent insulation adhesive layer interposed between the upper panel and the lower panel.

2. The capacitive touch panel as claimed in claim 1, wherein the lower panel further comprises a lower insulation layer mounted on the lower conductor layer and having a lower indentation to partially expose the lower conductor layer.

3. The capacitive touch panel as claimed in claim 2, wherein the lower panel further comprises a lower conductive adhesive layer mounted in the lower indentation of the lower insulation layer to cover the exposed portion of the lower conductor layer.

4. The capacitive touch panel as claimed in claim 3, further comprising a flexible circuit board mounted on the lower conductive adhesive layer, extending outwardly beyond the first glass substrate, and electrically connected with the lower touch sensitive layer through the lower conductive adhesive layer.

5. The capacitive touch pane as claimed in claim 4, further comprising an upper protection layer.

6. The capacitive touch panel as claimed in claim 5, wherein the flexible circuit board has a top surface and a bottom surface, wherein the bottom surface is attached to the lower conductive adhesive layer and the upper protection layer is bonded to the top surface of the flexible circuit board and a side of the second glass substrate.

7. The capacitive touch panel as claimed in claim 1, wherein the upper panel further comprises an upper insulation layer mounted on the upper conductor layer and having an upper indentation to partially expose the upper conductor layer.

8. The capacitive touch panel as claimed in claim 7, wherein the upper panel further comprises an upper conductive adhesive layer mounted in the upper indentation of the upper insulation layer.

9. The capacitive touch panel as claimed in claim 8, wherein the upper conductive adhesive layer is formed by at least one chosen from anisotropic conductive film (ACF) and anisotropic conductive paste (ACP).

10. A capacitive touch panel, comprising:
    a first glass substrate having a first circuit surface;
    a lower touch sensitive layer mounted on the first circuit surface of the first glass substrate;
    a lower conductor layer mounted on the first circuit surface of the first glass substrate and electrically connecting the lower touch sensitive layer;
    a transparent insulation adhesive layer mounted on the lower conductor layer;
    an upper conductor layer mounted on the transparent insulation adhesive layer;
    an upper insulation ink layer mounted on the upper conductor layer, and having a plurality of upper through slots formed through the upper insulation ink layer and each filled in with a upper conductive layer having a color identical to that of the upper insulation ink layer;
    an upper touch sensitive layer mounted on the transparent insulation adhesive layer, partially covering the upper insulation ink layer, and electronically connecting the upper conductor layer via the upper conductive layers in the corresponding upper through slots of the upper insulation ink layer; and
    a second glass substrate mounted on the upper touch sensitive layer and the upper insulation ink layer and having a second circuit surface in contact with the upper touch sensitive layer and the upper insulation ink layer.

11. The capacitive touch panel as claimed in claim 10, further comprising a lower insulation layer, wherein the lower insulation layer is configured on one surface of the lower conductor layer and the lower touch sensitive layer is configured on the other surface of the lower conductor layer and the lower insulation layer has a lower indentation to partially expose the lower conductor layer.

12. The capacitive touch panel as claimed in claim 11, further comprising a lower conductive adhesive layer mounted in the lower indentation of the lower insulation layer to cover the exposed portion of the lower conductor layer.

13. The capacitive touch panel as claimed in claim 12, further comprising a flexible circuit board mounted on the lower conductive adhesive layer, extending outwardly beyond the first glass substrate, and electrically connected with the lower touch sensitive layer through the lower conductive adhesive layer.

14. The capacitive touch panel as claimed in claim 13, further comprising an upper protection layer.

15. The capacitive touch panel as claimed in claim 14, wherein the flexible circuit board has a top surface and a bottom surface, wherein the bottom surface is attached to the lower conductive adhesive layer and the upper protection layer is bonded to the top surface of the flexible circuit board and a side of the second glass substrate.

16. The capacitive touch panel as claimed in claim 15, further comprising a lower protection layer bonded to the bottom surface of the flexible circuit board and a side of the first glass substrate.

17. The capacitive touch panel as claimed in claim 10, further comprising an upper insulation layer, wherein the upper insulation layer is configured on one surface of the upper conductor layer and the upper touch sensitive layer is configured on the other surface of the upper conductor layer and the upper insulation layer has an upper indentation to partially expose the upper conductor layer.

18. The capacitive touch panel as claimed in claim 17, further comprising an upper conductive adhesive layer mounted in the upper indentation of the upper insulation layer.

19. The capacitive touch panel as claimed in claim 18, wherein the upper conductive adhesive layer is formed by at least one chosen from anisotropic conductive film (ACF) and anisotropic conductive paste (ACP).

20. A capacitive touch panel, comprising:
a lower panel comprising:
- a first glass substrate having a first circuit surface;
- a lower touch sensitive layer mounted on the first circuit surface of the first glass substrate; and
- a lower conductor layer mounted on the first circuit surface of the first glass substrate and electrically connecting the lower touch sensitive layer;

an upper panel comprising:
- a second glass substrate having a second circuit surface;
- an upper touch sensitive layer mounted on the second circuit surface of the second glass substrate;
- an upper insulation ink layer mounted on an edge portion of the upper touch sensitive layer, and having a plurality of upper through slots formed through the upper insulation ink layer and each filled in with an upper conductive layer having a color identical to that of the upper insulation ink layer; and
- an upper conductor layer mounted on the upper insulation ink layer and electronically connecting the upper touch sensitive layer via the upper conductive layer; and wherein the lower panel is spaced apart from the upper panel.

21. The capacitive touch panel as claimed in claim 20, wherein the lower panel and the upper panel are spaced by a transparent insulation adhesive layer.

22. The capacitive touch panel as claimed in claim 20, wherein the lower panel further comprises a lower insulation layer mounted on the lower conductor layer and having a lower indentation to partially expose the lower conductor layer.

23. The capacitive touch panel as claimed in claim 22, wherein the lower panel further comprises a lower conductive adhesive layer mounted in the lower indentation of the lower insulation layer to cover the exposed portion of the lower conductor layer.

24. The capacitive touch panel as claimed in claim 23, further comprising a flexible circuit board mounted on the lower conductive adhesive layer, extending outwardly beyond the first glass substrate, and electrically connected with the lower touch sensitive layer through the lower conductive adhesive layer.

25. The capacitive touch panel as claimed in claim 24, further comprising an upper protection layer.

26. The capacitive touch panel as claimed in claim 25, wherein the flexible circuit board has a top surface and a bottom surface, wherein the bottom surface is attached to the lower conductive adhesive layer and the upper protection layer is bonded to the top surface of the flexible circuit board and a side of the second glass substrate.

27. The capacitive touch panel as claimed in claim 26, further comprising a lower protection layer bonded to the bottom surface of the flexible circuit board and a side of the first glass substrate.

28. The capacitive touch panel as claimed in claim 20, wherein the upper panel further comprises an upper insulation layer mounted on the upper conductor layer and having an upper indentation to partially expose the upper conductor layer.

29. The capacitive touch panel as claimed in claim 28, wherein the upper panel further comprises an upper conductive adhesive layer mounted in the upper indentation of the upper insulation layer.

30. The capacitive touch panel as claimed in claim 29, wherein the upper conductive adhesive layer is formed by at least one chosen from anisotropic conductive film (ACF) and anisotropic conductive paste (ACP).

* * * * *